(12) United States Patent
Mooring et al.

(10) Patent No.: US 10,790,237 B2
(45) Date of Patent: Sep. 29, 2020

(54) FIDUCIAL-FILTERING AUTOMATIC WAFER CENTERING PROCESS AND ASSOCIATED SYSTEM

(71) Applicant: Lam Research Corporation, Fremont, CA (US)

(72) Inventors: Benjamin W. Mooring, Austin, TX (US); Damon Tyrone Genetti, Livermore, CA (US)

(73) Assignee: Lam Research Corporation, Fremont, CA (US)

( * ) Notice: Subject to any disclaimer, the term of this patent is extended or adjusted under 35 U.S.C. 154(b) by 81 days.

(21) Appl. No.: 16/131,692

(22) Filed: Sep. 14, 2018

(65) Prior Publication Data

US 2020/0091085 A1    Mar. 19, 2020

(51) Int. Cl.
*H01L 23/544* (2006.01)
*H01L 21/68* (2006.01)
*H01L 21/67* (2006.01)

(52) U.S. Cl.
CPC ...... *H01L 23/544* (2013.01); *H01L 21/67259* (2013.01); *H01L 21/681* (2013.01); *H01L 2223/54426* (2013.01); *H01L 2223/54493* (2013.01)

(58) Field of Classification Search
None
See application file for complete search history.

(56) References Cited

U.S. PATENT DOCUMENTS

| | | | |
|---|---|---|---|
| 6,405,101 B1* | 6/2002 | Johanson | H01L 21/681 356/73 |
| 6,629,053 B1* | 9/2003 | Mooring | G05B 19/401 702/149 |
| 8,634,633 B2* | 1/2014 | Kiley | H01L 21/681 382/141 |
| 2004/0151574 A1* | 8/2004 | Lu | H01L 21/681 414/816 |

(Continued)

FOREIGN PATENT DOCUMENTS

KR    10-2016-0103125 A    8/2016

OTHER PUBLICATIONS

International Search Report and Written Opinion of the International Searching Authority, PCT/US2019/050256, dated Jan. 20, 2020, 10 pages.

*Primary Examiner* — Jason Lin
(74) *Attorney, Agent, or Firm* — Penilla IP, APC

(57) ABSTRACT

Each sensor in an array of sensors detects and signals when an edge of a wafer passes by the sensor on a wafer handling component of a robot. A number (N) of detected wafer edge locations is determined. Each detected wafer edge location is a set of coordinates (x, y) in a coordinate system of the wafer handling component. For each unique set of (N−1) of the number (N) of detected wafer edge locations, an estimated wafer offset is determined that substantially minimizes a performance index value. The estimated wafer offset is a vector extending from a center of the coordinate system of the wafer handling component to an estimated center location of the wafer. A final wafer offset is identified as the estimated wafer offset that has a smallest corresponding performance index value. The final wafer offset is used to center the wafer at a target station.

20 Claims, 7 Drawing Sheets

(56) References Cited

U.S. PATENT DOCUMENTS

| | | | |
|---|---|---|---|
| 2004/0167743 A1* | 8/2004 | Hosek | G03F 7/7075 |
| | | | 702/155 |
| 2006/0222477 A1* | 10/2006 | Moura | H01L 21/67748 |
| | | | 414/217 |
| 2008/0013089 A1* | 1/2008 | Ishii | G03F 9/7011 |
| | | | 356/400 |
| 2008/0161961 A1* | 7/2008 | Piggott | B23Q 17/20 |
| | | | 700/114 |
| 2013/0022260 A1 | 1/2013 | Pai et al. | |
| 2013/0040421 A1 | 2/2013 | Meisel | |
| 2015/0243018 A1 | 8/2015 | Vajaria et al. | |
| 2016/0329229 A1 | 10/2016 | Sun et al. | |
| 2017/0004987 A1* | 1/2017 | Fairbairn | H01L 21/681 |
| 2017/0236303 A1* | 8/2017 | Sano | G06K 9/4642 |
| | | | 348/87 |
| 2018/0046097 A1 | 2/2018 | Zhou et al. | |

* cited by examiner

FIDUCIAL-FILTERING AUTOMATIC WAFER CENTERING PROCESS AND ASSOCIATED SYSTEM

BACKGROUND

1. Field of the Disclosure

The present disclosure relates to semiconductor device fabrication.

2. Description of the Related Art

In the fabrication of semiconductor devices such as integrated circuits, memory cells, and the like, a series of manufacturing operations are performed to define features on a semiconductor wafer ("wafers" hereafter). The wafer includes integrated circuit devices in the form of multi-level structures defined on a silicon substrate. At a substrate level, transistor devices with diffusion regions are formed. In subsequent levels, interconnect metallization lines are patterned and electrically connected to the transistor devices to define a desired integrated circuit device. Also, patterned conductive layers are insulated from other conductive layers by dielectric materials.

A number of the various wafer manufacturing operations require handling and placement of the wafer on a wafer support structure within a target station, e.g., within processing chamber. Such placement of the wafer on the wafer support structure is done remotely using a robotic device. It is generally important that the wafer be placed on the wafer support structure in a known position relative to the wafer support structure. For example, it may be specified that the wafer should be centered within a wafer receiving area of the wafer support structure. However, when the wafer is handled/carried by the robotic device, the position of the wafer relative to the robotic device may need to be determined in order to enable correct placement of the wafer at the target station. It is within this context that the present disclosure arises.

SUMMARY

In an example embodiment, a method is disclosed for automatic wafer centering. The method includes having a wafer positioned on a wafer handling component of a robot. The method includes operating the robot to move the wafer handling component so that the wafer is moved through an array of sensors. Each sensor within the array of sensors is configured to detect and signal when an edge of the wafer passes by the sensor. The method includes determining a number (N) of detected wafer edge locations. Each detected wafer edge location is defined by a set of coordinates (x, y) in a coordinate system of the wafer handling component at which any sensor of the array of sensors detects the edge of the wafer as the wafer is moved through the array of sensors. The method includes determining, for each unique set of (N−1) of the number (N) of detected wafer edge locations, an estimated wafer offset that substantially minimizes a performance index value. The estimated wafer offset defined as a vector extending from a center of the coordinate system of the wafer handling component to an estimated center location of the wafer. Each unique set of (N−1) of the number (N) of detected wafer edge locations having a corresponding estimated wafer offset and a corresponding performance index value. The method also includes identifying a final wafer offset as the estimated wafer offset corresponding to the unique set of (N−1) of the number (N) of detected wafer edge locations that has a smallest corresponding performance index value. And, the method includes using the final wafer offset to center the wafer at a target station.

In an example embodiment, a system for automatic wafer centering is disclosed. The system include an array of sensors. Each sensor within the array of sensors is configured to detect when an edge of a wafer passes by the sensor. The system also includes a controller configured to receive data indicating a position of a wafer handling component of a robot as the wafer handling component is moved with a wafer held on the wafer handling component. The controller is configured to receive signals from the array of sensors as the wafer is moved through the array of sensors. The signals indicate when the edge of the wafer passes by a particular sensor of the array of sensors. The controller is also configured to determine a number (N) of detected wafer edge locations. Each detected wafer edge location is defined by a set of coordinates (x, y) in a coordinate system of the wafer handling component at which any sensor of the array of sensors detects the edge of the wafer. The controller is also configured to determine an estimated wafer offset that substantially minimizes a performance index value for each unique set of (N−1) of the number (N) of detected wafer edge locations. The estimated wafer offset is defined as a vector extending from a center of the coordinate system of the wafer handling component to an estimated center location of the wafer. Each unique set of (N−1) of the number (N) of detected wafer edge locations has a corresponding estimated wafer offset and a corresponding performance index value. The controller is also configured to identify a final wafer offset as the estimated wafer offset corresponding to the unique set of (N−1) of the number (N) of detected wafer edge locations that has a smallest corresponding performance index value. The controller is configured to use the final wafer offset to direct the robot to center the wafer at a target station.

In an example embodiment, a method is disclosed for automatic wafer centering. The method includes acquiring a number (N) of detected wafer edge locations. Each detected wafer edge location is defined by a set of coordinates (x, y) in a coordinate system of a wafer handling component. The method also includes determining a minimized performance index value for each unique set of (N−1) of the number (N) of detected wafer edge locations. The minimized performance index value has an associated estimated wafer offset that corresponds to a center of a circle that is best fit to a corresponding unique set of (N−1) of the number (N) of detected wafer edge locations within the coordinate system of the wafer handling component. The method also includes determining a smallest minimized performance index value for the number (N) of detected wafer edge locations. The method also includes using the smallest minimized performance index value and its associated wafer offset to center the wafer at a target station.

DETAILED DESCRIPTION

In the following description, numerous specific details are set forth in order to provide an understanding of embodiments of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Automatic Wafer Centering (AWC) is a process where a robot moves a semiconductor wafer ("wafer" hereafter) through a set of sensors in an effort to determine precisely where the wafer is positioned on a blade, i.e., end effector or wafer handling component, of the robot. The purpose of the set of sensors is to generate a signal when the wafer edge moves past a defined point in the wafer plane of motion. Typically, a through-beam optical sensor is positioned so that the leading edge of the wafer will interrupt the beam and the trailing edge of the wafer will uncover the beam. At each beam transition, a signal is sent to the robot and the robot instantly stores its position when the sensor transitions. In the manner, the position of the blade of the robot relative to the sensor is recorded when the sensor transitions.

A wafer offset is defined as the spatial relationship between the center of the wafer and the center of the blade coordinate system. Therefore, the wafer offset is defined as a vector extending from the center of the blade coordinate system to the center of the wafer. With zero wafer offset, the center of the wafer is located at the center of the blade coordinate system. The center of the blade coordinate system is tracked and known as the robot moves the blade. Therefore, by knowing where the center of the blade coordinate system is at any given position of the blade, the AWC process is able to determine the wafer offset based on interaction of the wafer with the set of sensors as the wafer is moved through the set of sensors. Any error in the position of the wafer on the blade, i.e., the wafer offset, may then be corrected when the wafer is placed at a target station, such as on a chuck within a processing chamber.

Figure 1A:
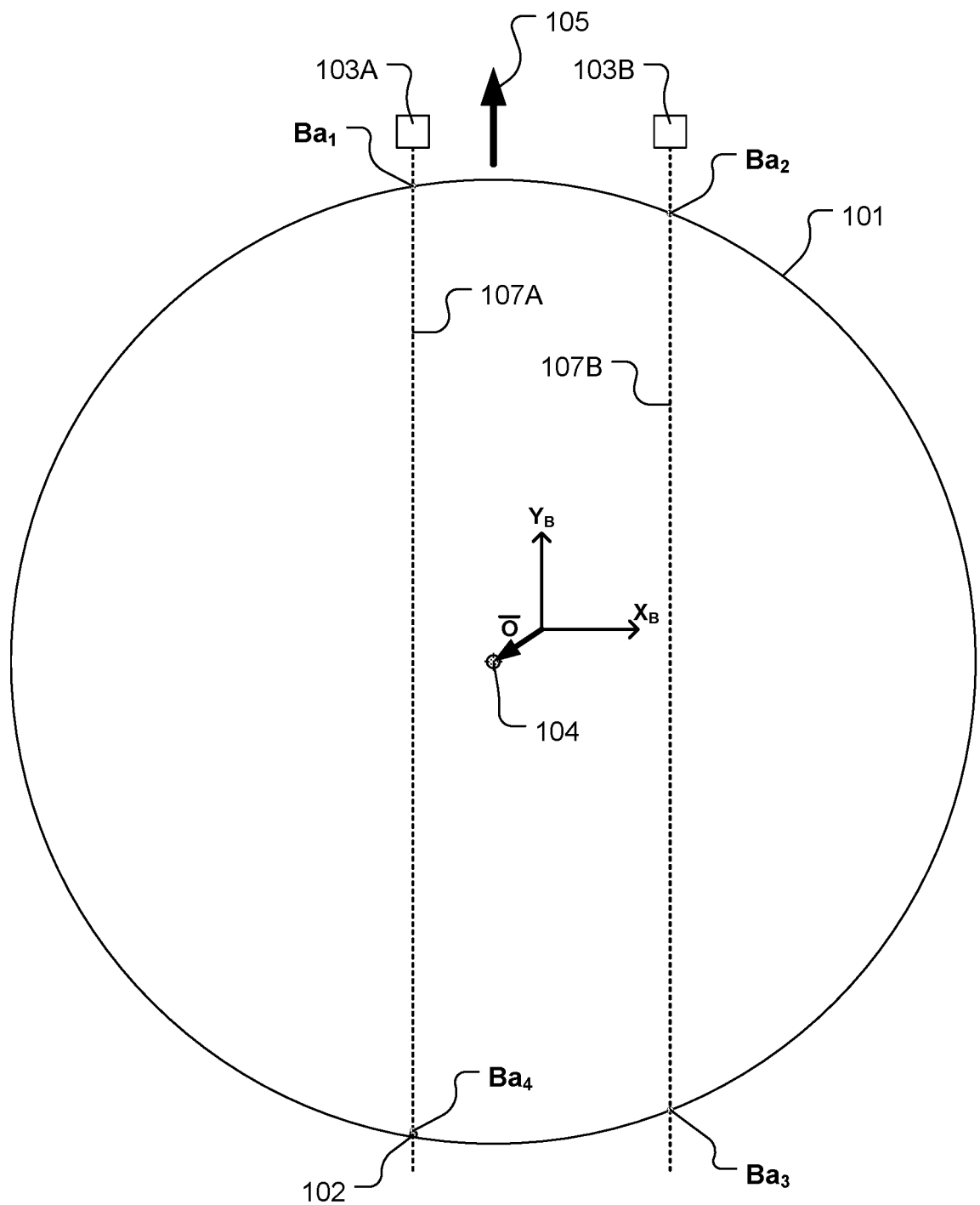
FIG. 1A shows a top view of a wafer relative to sensors, in accordance with some embodiments.
Figure 1B:
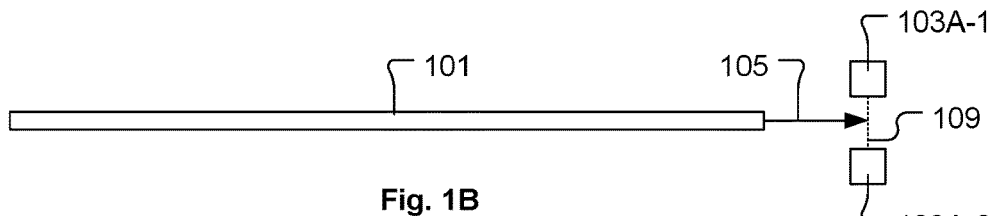
FIG. 1B shows a side view of the wafer relative to the sensor, where the sensor includes two sensor components, in accordance with some embodiments.

FIG. 1A shows a top view of a wafer 101 relative to sensors 103A and 103B, in accordance with some embodiments. FIG. 1B shows a side view of the wafer 101 relative to the sensor 103A, where the sensor includes two sensor components 103A-1 and 103A-2, in accordance with some embodiments. In some embodiments, the sensors 103A and 103B are configured as light emitting diode (LED) beam sensors that operate by transmitting signals when the LED beam is broken and when the LED beam is reformed. For example, as shown in FIG. 1B, a first sensor component 103A-1 operates as a beam transmitter to transmit a light beam 109 to a second sensor component 103A-2, which operates as a beam detector to transmit a signal when the beam is broken and to transmit a signal when the beam is reformed. It should be understood that the operations of sensor components 103A-1 and 103A-2 can be reversed. Also, it should be understood that in other embodiments, various other types of sensors may be used in place of the LED beam sensors 103A and 103B, so long as the sensors are capable of detecting when the edge of the wafer 101 passes a detecting location of the sensor.

In the example of FIG. 1A, the wafer 101 is positioned on the blade of the robot and is moved by the robot in a direction 105 through the sensors 103A and 103B. Therefore, as the wafer 101 moves through the sensors 103A and 103B, the beams of the sensors 103A and 103B travel along paths 107A and 107B, respectively. The example of FIG. 1A shows the beams of the sensors 103A and 103B traveling along straight paths 107A and 107B across the wafer 101 as the wafer 101 is moved through the sensors 103A and 103B. However, it should be understood that in some embodiments, the wafer 101 can be moved by the robot in a non-linear manner through the sensors 103A and 103B, which will cause the beams of the sensors 103A and 103B to travel across the wafer 101 along non-linear paths. As the wafer 101 is moved in the direction 105, the leading outer peripheral edge of the wafer 101 reaches and blocks the beam of the sensor 103A at a location $Ba_1$ and reaches and blocks the beam of the sensor 103B at a location $Ba_2$. As the wafer 101 continues movement in the direction 105, the trailing outer peripheral edge of the wafer 101 passes the sensors 103A and 103B so that the beams of the sensors 103A and 103B are unblocked at locations $Ba_3$ and $Ba_4$, respectively. In this manner, as the wafer 101 is moved through the sensors 103A, 103B, the leading edge of the wafer 101 breaks the sensor beam 109 and the trailing edge of the wafer 101 reforms the sensor beam 109. Each time the sensor beam 109 transitions, i.e., breaks or reforms, an interrupt signal is transmitted from the sensor 103A, 103B to trigger recording of the current blade position. Each of the detected wafer edge locations $Ba_1$, $Ba_2$, $Ba_3$, and $Ba_4$ are specified within the coordinate system of the blade represented by the coordinate axes $X_B$ and $Y_B$.

Figure 1C:
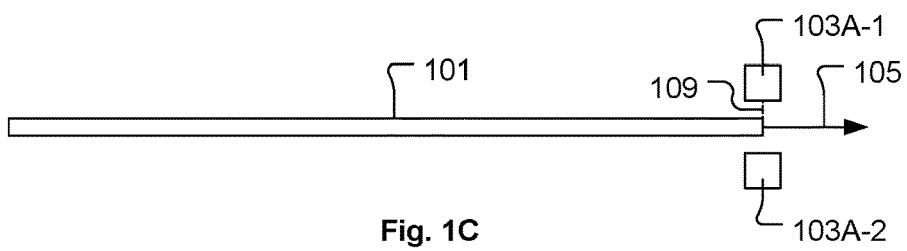
FIG. 1C shows the wafer at the instance when the leading outer peripheral edge of the wafer reaches and blocks the beam of the sensor, in accordance with some embodiments.
Figure 1D:
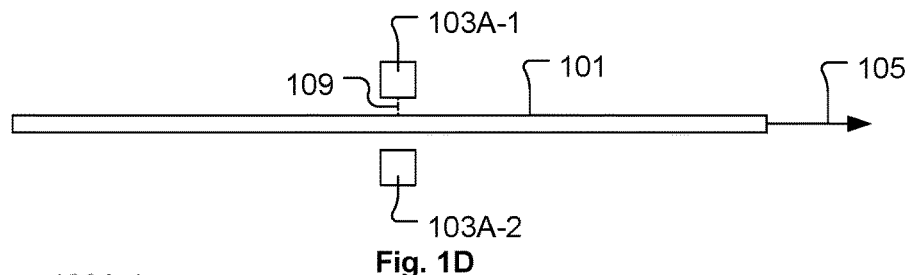
FIG. 1D shows the wafer continuing movement through the sensor with the beam blocked by the wafer, in accordance with some embodiments.
Figure 1E:
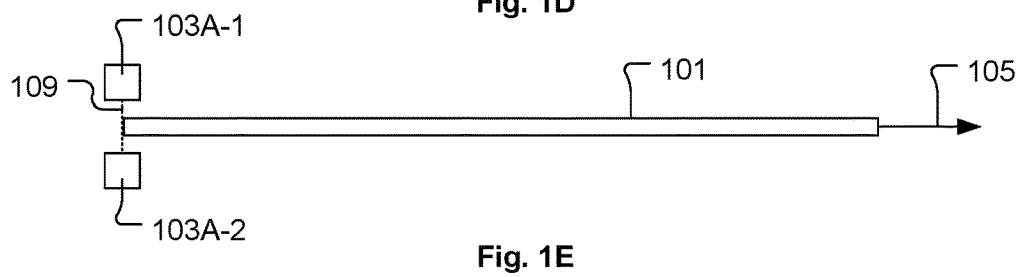
FIG. 1E shows the wafer at the instance when the trailing outer peripheral edge of the wafer passes the sensor so that the beam of the sensor is unblocked, in accordance with some embodiments.

FIG. 1B shows the wafer 101 approaching the sensor 103A in the direction 105. In FIG. 1B, the beam 109 is unbroken between the first sensor component 103A-1 and the second sensor component 103A-2. FIG. 1C shows the wafer 101 at the instance when the leading outer peripheral edge of the wafer 101 reaches and blocks the beam 109 of the sensor 103A at the location $Ba_1$. FIG. 1D shows the wafer 101 continuing movement through the sensor 103A with the beam 109 blocked by the wafer 101. FIG. 1E shows the wafer 101 at the instance when the trailing outer peripheral edge of the wafer 101 passes the sensors 103A so that the beam 109 of the sensors 103A is reformed (unblocked) at location $Ba_4$.

In some embodiments, the robot has a digital input/output (I/O) card. The sensors 103A and 103B are connected to the digital I/O card of the robot. When the sensor 103A, 103B is triggered (by detecting blockage of the beam 109 or by detecting unblockage of the beam 109), the sensor 103A, 103B sends an interrupt signal to the digital I/O card of the robot, which causes the robot to store its current blade position data in a digital storage. In some embodiments, after the wafer 101 has passed through the sensors 103A and 103B, the blade position data corresponding to when the sensors 103A and 103B were triggered is downloaded from the robot to a control system for AWC processing. In some embodiments, the control system for AWC processing is implemented onboard the robot. In these embodiments, the blade position data corresponding to when the sensors 103A and 103B were triggered is made available to the control system for AWC processing on the robot, without having to download the blade position data to another control system separate from the robot.

The beam 109 locations of the sensors 103A and 103B relative to the center of the blade coordinate system can be determined through a calibration process in which a calibration wafer (of precise and uniform diameter) is positioned on the blade in a centered manner (with the wafer precisely centered at the center of the blade coordinate system) and the calibration wafer is moved through the sensors 103A and 103B. By knowing the calibrated positions of the beam 109 locations of the sensors 103A and 103B relative to the center of the blade coordinate system for a true centered wafer, the detected locations $Ba_1$, $Ba_2$, $Ba_3$, and $Ba_4$ for a non-centered wafer (a wafer that is not centered on the blade) can be used to determine the center coordinates of the non-centered wafer within the blade coordinate system, and in turn determine the wafer offset for the non-centered wafer. In FIG. 1A, the wafer offset is depicted by a vector O extending from the center of the blade coordinate system to a center 104 of the wafer 101.

The vast majority of wafers have a fiducial, i.e., notch, that is used to determine and set the angular position of the wafer. This fiducial is typically in the form of a notch at one location on the edge of the wafer. For example, FIG. 1A shows the wafer 101 having a fiducial 102. The basis for the AWC algorithm that computes the wafer offset O is the assumption that the sensors 103A, 103B precisely determine points that are on the circumference of the wafer 101. If it so happens that the fiducial 102 moves under one of the sensors 103A, 103B, such as shown in FIG. 1A, the wafer edge location reported by the sensor will not lie on the wafer circumference and the results of the AWC calculation of wafer offset O will be in error.

Many of the tools within a semiconductor fabrication facility have an aligner (wafer aligner) somewhere in the wafer flow of the tool. One purpose of the aligner is to locate the fiducial 102 and rotate the wafer so that the fiducial 102 is at a specified azimuthal position. Typically, the fiducial 102 is positioned so that it will not pass through any of the sensors 103A, 103B used in the AWC process, regardless of the target station to which the wafer may be transferred. This eliminates the requirement that the AWC process and associated algorithm(s) consider possible fiducial 102 interference with the sensors 103A, 103B. However, some disadvantages of using the aligner in the wafer flow of the tool are the cost of the aligner and the degradation of wafer processing throughput because of the time required to move the wafer into the aligner, operate the aligner to locate and position the fiducial 102 of the wafer, and retrieve the wafer from the aligner. Therefore, in some situations, addition of an aligner in the wafer flow of the tool is not justified and the AWC system must attempt to determine if there is fiducial 102 interference with any of the sensors 103A, 103B, and, if so, which sensor data is affected.

Figure 1F:
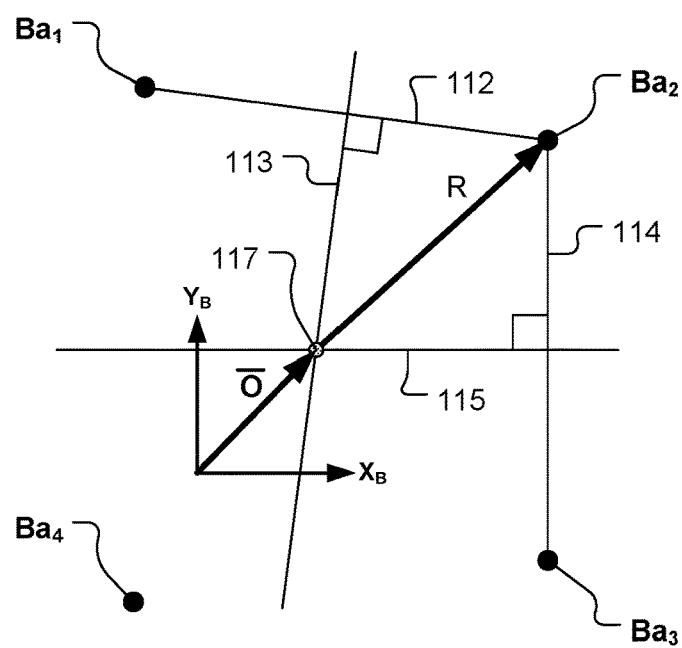
FIG. 1F shows a vector diagram of the detected wafer edge locations in the blade coordinate system, in accordance with some embodiments.

As shown in FIG. 1A, an example AWC process uses a sensor array that includes the two sensors 103A and 103B to generate a total of four sensor signals corresponding to the detected wafer edge locations $Ba_1$, $Ba_2$, $Ba_3$, and $Ba_4$ as the wafer is moved through the sensor array. Each of the sensor signals and associated robot positions are used to compute the corresponding detected wafer edge locations ($Ba_1$, $Ba_2$, $Ba_3$, and $Ba_4$) in the blade coordinate system. FIG. 1F shows a vector diagram of the detected wafer edge locations $Ba_1$, $Ba_2$, $Ba_3$, and $Ba_4$ in the blade coordinate system. The objective of the AWC process is to determine the wafer offset O, i.e., to determine the location of the wafer center relative to the center of the blade coordinate system. The conventional AWC process includes selection of any three of the detected wafer edge locations (any three of $Ba_1$, $Ba_2$, $Ba_3$, and $Ba_4$) for use in the analysis to determine the wafer offset O. It is assumed that the three detected wafer edge locations that are selected will uniquely define a circle corresponding to an estimated wafer radius R and an estimated wafer center 117. The estimated wafer center 117 is given by the intersection of perpendicular bisectors 113 and 115 of lines 112 and 114, respectively, that extend between adjacent detected wafer edge locations ($Ba_1$, $Ba_2$, $Ba_3$) used in the analysis. The estimated wafer radius R is the distance between the estimated wafer center 117 and any of the adjacent detected wafer edge locations ($Ba_1$, $Ba_2$, $Ba_3$) used in the analysis.

For the AWC process that uses two sensors 103A and 103B to generate four sensor signals corresponding to the detected wafer edge locations $Ba_1$, $Ba_2$, $Ba_3$, and $Ba_4$, there are four sets of three detected wafer edge locations: Set 1=($Ba_1$, $Ba_2$, $Ba_3$); Set 2=($Ba_2$, $Ba_3$, $Ba_4$); Set 3=($Ba_1$, $Ba_3$, $Ba_4$); and Set 4=($Ba_1$, $Ba_2$, $Ba_4$). FIG. 1F shows use of Set 1 to determine the estimated wafer center 117 and the estimated wafer radius R. In the AWC process, each of Set 1, Set 2, Set 3, and Set 4 is used to determine the estimated wafer center 117 and the estimated wafer radius R. If the fiducial 102 of the wafer interfered with any of the four sensor signals, only one of Set 1, Set 2, Set 3, and Set 4 will not be affected by the fiducial 102. For example, if the sensor signal corresponding to the detected wafer edge location $Ba_3$ was affected by the fiducial 102, only the Set 4=($Ba_1$, $Ba_2$, $Ba_4$) will be free of the error introduced by the fiducial 102 interference. Assuming that fiducial 102 interference has occurred, the correct set of three detected wafer edge locations (Set 1, Set 2, Set 3, or Set 4) for use in determining the estimated wafer center 117 and corresponding wafer offset O is determined by comparing the estimated wafer radius R associated with each of Set 1, Set 2, Set 3, and Set 4 to the known wafer radius. Assuming that fiducial 102 interference has occurred, only one value of R for the four sets of three detected wafer edge locations (Set 1, Set 2, Set 3, Set 4) should be correct. And, the particular set of three detected wafer edge locations (Set 1, Set 2, Set 3, Set 4) that gives the correct R value is the set of three detected wafer edge locations for use in determining the estimated wafer center 117 and corresponding wafer offset O. Again, the wafer offset O is the vector extending from the center of the blade coordinate system to the center of the wafer as the wafer is held by the blade. Therefore, the coordinates of the estimated wafer center 117 in the blade coordinate system defines the wafer offset O.

It should be noted that only one of the detected wafer edge locations $Ba_1$, $Ba_2$, $Ba_3$, and $Ba_4$ will be affected by the fiducial 102. Also, it should be noted that rarely will the fiducial 102 pass directly under a sensor 103A, 103B. More often, some portion of the fiducial 102 closer to the wafer edge effects the sensor transition, and there is only a small error induced by the fiducial 102 in determining the estimated wafer radius R based on a given set (Set 1, Set 2, Set 3, Set 4) of three detected wafer edge locations. In these cases, it becomes difficult to separate error caused by the fiducial 102 interference from other errors in the AWC system, such as from errors in calibration of the sensor locations and/or errors in tracking the precise position of the center of the blade coordinate system as the blade moves. In most cases, the above-described AWC process algorithm uses a threshold value of error in the estimated wafer radius R to determine whether or not fiducial 102 interference has occurred. For example, a difference between the known wafer radius and the estimated wafer radius R determined based on a given set (Set 1, Set 2, Set 3, Set 4) of three detected wafer edge locations would have to exceed a preset threshold value of error in the estimated wafer radius R to conclude that the estimated wafer radius R is affected by fiducial 102 interference. However, setting the preset threshold value of error in the estimated wafer radius R is an arbitrary action, and is itself subject to error.

Figure 2:
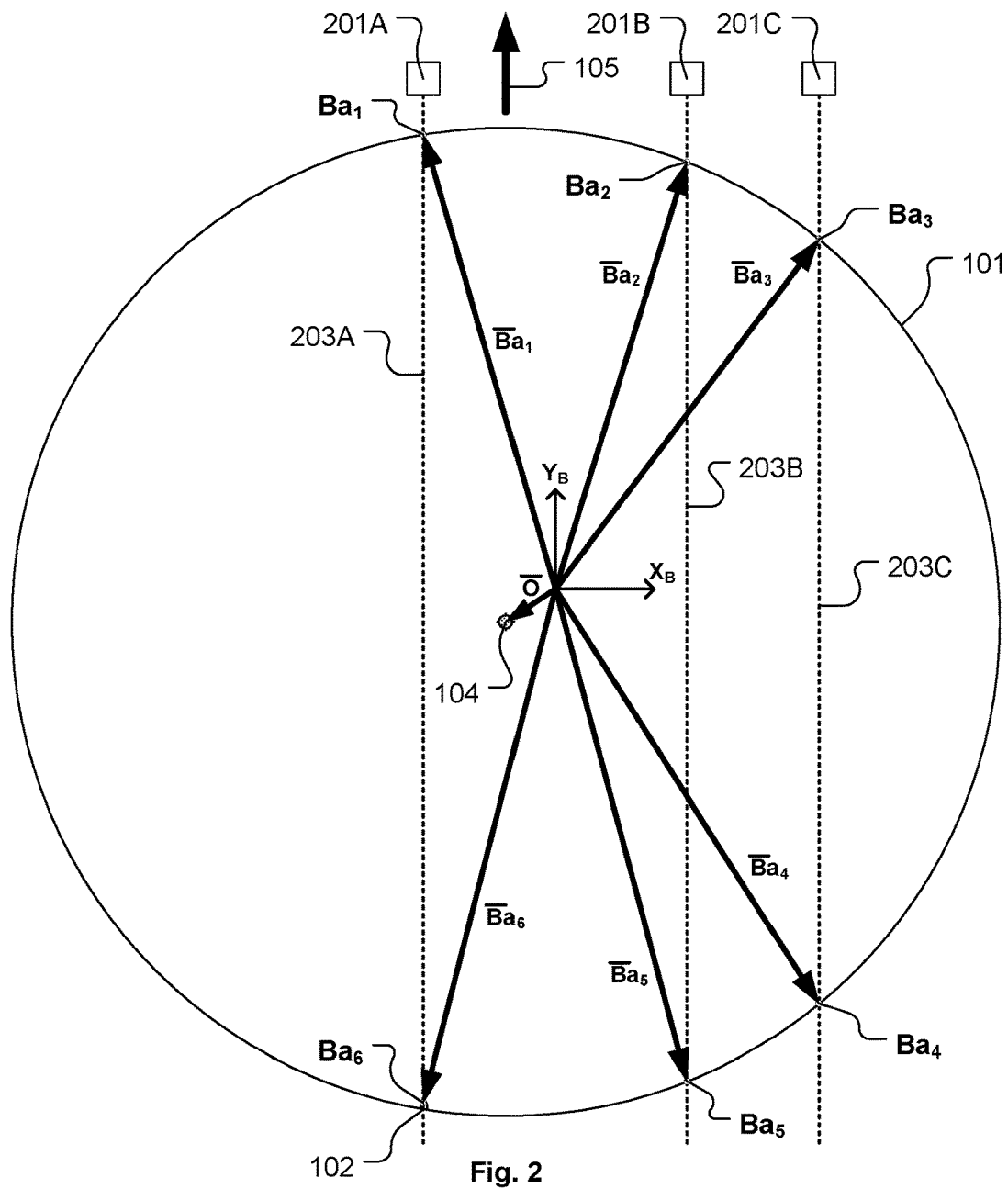
FIG. 2 shows a top view of the wafer relative to three sensors, in accordance with some embodiments.

Methods and systems are disclosed herein for a fiducial-filtering AWC process and algorithm that uses data returned from AWC sensors to 1) determine if a fiducial 102 has caused one of the sensors to report invalid wafer edge data, and 2) eliminate the erroneous wafer edge data so that the determined wafer offset O is accurate. FIG. 2 shows a top view of the wafer 101 relative to three sensors 201A, 201B, and 201C, in accordance with some embodiments. In some embodiments, the sensors 201A, 201B, and 201C are configured as LED beam sensors that operate by transmitting a signal when the LED beam is broken and when the LED beam is reformed, like the above-mentioned sensors 103A and 103B. However, it should be understood that in other embodiments, various other types of sensors may be used in place of the LED beam sensors 201A, 201B, and 201C, so long as the sensors are capable of detecting when the edge of the wafer 101 passes a detecting location of the sensor.

In the example of FIG. 2, the wafer 101 is positioned on the blade of the robot and is moved by the robot in a direction 105 through the sensors 201A, 201B, and 201C. Therefore, as the wafer 101 moves through the sensors 201A, 201B, and 201C, the beams of the sensors 201A, 201B, and 201C travel along paths 203A, 203B, and 203C, respectively. In the example of FIG. 2, the beam of sensor 201A encounters the fiducial 102 of the wafer 101. The example of FIG. 2 shows the beams of the sensors 201A, 201B, and 201C traveling along straight paths 203A, 203B, and 203C across the wafer 101, as the wafer 101 is moved through the sensors 201A, 201B, and 201C. However, it should be understood that in some embodiments, the wafer 101 can be moved by the robot in a non-linear manner through the sensors 201A, 201B, and 201C, which will cause the beams of the sensors 201A, 201B, and 201C to travel across the wafer 101 along non-linear paths.

As the wafer 101 is moved in the direction 105, the leading edge of the wafer 101 reaches and blocks the beam of the sensor 201A at a location $Ba_1$, and reaches and blocks the beam of the sensor 201B at a location $Ba_2$, and reaches and blocks the beam of the sensor 201C at a location $Ba_3$. As the wafer 101 continues movement in the direction 105, the trailing edge of the wafer 101 reaches and unblocks the beam of the sensor 201C at a location $Ba_4$, and reaches and unblocks the beam of the sensor 201B at a location $Ba_5$, reaches and unblocks the beam of the sensor 201A at a location $Ba_6$. In this manner, as the wafer 101 is moved through the sensors 201A, 201B, and 201C, the leading edge of the wafer 101 breaks the sensor beam 109 and the trailing edge of the wafer 101 reforms the sensor beam 109. Each time the sensor beam 109 transitions, i.e., breaks or reforms, an interrupt signal is transmitted from the sensor to trigger recording of the current blade position. Each of the detected wafer edge locations $Ba_1$, $Ba_2$, $Ba_3$, $Ba_4$, $Ba_5$, and $Ba_6$ are specified within the coordinate system of the blade represented by the coordinate axes $X_B$ and $Y_B$. In some embodiments, the three sensors 201A, 201B, and 201C are positioned so that at least one sensor will track over each half of the wafer 101. For example, in FIG. 2, sensor 201A tracks over a left half of the wafer 101, and sensors 201B and 201C track over the right half of the wafer 101. Also, in some embodiments, the sensors 201A, 201B, 201C are positioned so that only one sensor transition will occur at a given time. For example, in FIG. 2, the sensors 201A, 201B, 201C are positioned so that as the wafer moves in the direction 105, sensor 201A will trigger first, followed by sensor 201B, followed by sensor 201C, followed again by sensor 201C, followed by sensor 201B, followed by sensor 201A. In this manner, each signal received from the sensors 201A, 201B, 201C can be correlated to a particular one of the sensors 201A, 201B, 201C based on a sequence in which the signals are received.

A calibration process can be performed in which a calibration wafer (of precise and uniform diameter) is positioned on the blade in a centered manner (with the calibration wafer precisely centered at the center of the blade coordinate system) and the calibration wafer is moved through the sensors 201A, 201B, and 201C. This calibration process gives the locations of the sensors 201A, 201B, 201C relative to the center of the blade coordinate system for a centered wafer that causes transition of the sensors 201A, 201B, 201C. The results of the calibration process along with the robot geometry and some coordinate transformations allows a set of vectors $Ba_i$ (for i=1 to N) to be defined that extend from the center of the blade coordinate system to the locations of the of the detected wafer edge locations (e.g., $Ba_1$, $Ba_2$, $Ba_3$, $Ba_3$, $Ba_4$, $Ba_5$, and $Ba_6$) where sensor transitions occurred. More specifically, as shown in FIG. 2, each of the detected wafer edge locations $Ba_1$, $Ba_2$, $Ba_3$, $Ba_4$, $Ba_5$, and $Ba_6$ defines a corresponding vector $Ba_1$, $Ba_2$, $Ba_3$, $Ba_4$, $Ba_5$, and $Ba_6$, respectively, emanating from the center of the blade coordinate system as represented by the coordinate axes $X_B$ and $Y_B$. The vectors $Ba_i$ (for i=1 to 6) are determined as the robot moves the blade in the direction 105 to pass the wafer 101 through the sensors 201A, 201B, and 201C. The set of vectors $Ba_i$ (for i=1 to 6) can be used to determine the coordinates of the center 104 of the non-centered wafer within the blade coordinate system and in turn determine the wafer offset O for the non-centered wafer.

The number (N) of vectors $Ba_i$ (for i=1 to N) depends on the number of sensors used in the AWC process. In some embodiments, the fiducial-filtering AWC process uses at least three sensors 201A, 201B, 201C. Each sensor 201A, 201B, 201C typically transitions twice (once when the beam is broken and once when the beam is reformed). Therefore, the number (N) of vectors $Ba_i$ is twice the number of sensors 201A, 201B, 201C. Sometimes, however, a beam of a given sensor can be broken by the leading edge of the wafer 101, but not reformed because of the robot blade geometry. In this case, there will be only one vector for the given sensor. The fiducial-filtering AWC process requires that the number (N) of vectors $Ba_i$ be specified along with the nominal wafer diameter, e.g., 200 mm, 300 mm, etc.

The fiducial-filtering AWC process uses a best-fit algorithm to determine the wafer offset O and to determine whether or not fiducial interference occurs. The best-fit algorithm determines the location of the wafer center 104 within the blade coordinate system that best fits the detected wafer edge locations defined by the set of vectors $Ba_i$ (for i=1 to N). The output of the best-fit algorithm includes the x-coordinate ($O_x$) and the y-coordinate ($O_y$) of the wafer center 104 in the blade coordinate system with any effect from fiducial 102 interference eliminated. The x-coordinate ($O_x$) and the y-coordinate ($O_y$) of the wafer center 104 define the wafer offset O. The best-fit algorithm determines the best fit of a circle to the detected wafer edge locations defined by the set of N vectors $Ba_i$ (for i=1 to N). The best-fit algorithm includes definition of a performance index (IP) that is the square of the difference between an estimated wafer radius E and the nominal wafer radius R, given a wafer offset O, and summed over the N detected wafer edge locations.

Figure 3:
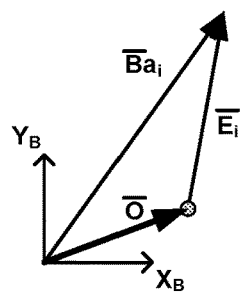
FIG. 3 shows a vector diagram that depicts a relationship between the wafer offset O, the vector $Ba_i$, and the estimated wafer radius $E_i$, for a given detected wafer edge location (i), in accordance with some embodiments.

FIG. 3 shows a vector diagram that depicts a relationship between the wafer offset O, the vector $Ba_i$, and the estimated wafer radius $E_i$, for a given detected wafer edge location (i), in accordance with some embodiments. As shown in FIG. 3, for each of the N vectors $Ba_i$ (for i=1 to N), the relationship of Equation 1 exists. In Equation 1, O is the current estimate of the wafer offset O, and $E_i$ is a vector corresponding to the i-th estimated wafer radius extending from the current estimate of the wafer offset O to the i-th detected wafer edge location $Ba_i$.

$$Ba_i = O + E_i \qquad \text{Equation 1.}$$

The relationship of Equation 1 can be rewritten as shown in Equation 2.

$$E_i = Ba_i - O \qquad \text{Equation 2.}$$

The magnitude of $E_i$ is given by Equation 3, where $Ba_{ix}$ is the x-coordinate of the i-th detected wafer edge location $Ba_i$ in the blade coordinate system, and $Ba_{iy}$ is the y-coordinate of the i-th detected wafer edge location $Ba_i$ in the blade coordinate system, and $O_x$ is the x-coordinate of the estimated wafer center in the blade coordinate system, and $O_y$ is the y-coordinate of the estimated wafer center in the blade coordinate system.

$$|E_i| = \sqrt{(Ba_{ix} - O_x)^2 + (Ba_{iy} - O_y)^2} \qquad \text{Equation 3.}$$

If the current values of $O_x$ and $O_y$ are close to the wafer center, the magnitude of $E_i$ will be close to the nominal wafer radius R. As shown in Equation 4, the performance index (IP) for any estimated wafer center ($O_x$, $O_y$) is the square of the difference between the estimated wafer radius OEM at the i-th detected wafer edge location and the nominal wafer radius R summed over the N detected wafer edge locations.

$$IP = \sum_{i=1}^{N} [R - \sqrt{(Ba_{ix} - O_x)^2 + (Ba_{iy} - O_y)^2}]^2 \qquad \text{Equation 4.}$$

If there is no error in the calibration of the sensor locations or in tracking of the blade position or in the data collection process, and if there is no fiducial interference with the sensors, the best-fit algorithm will iterate on $O_x$ and $O_y$ until the performance index (IP) is zero. In reality, there will likely be some amount of AWC system error, though small, in the calibration of the sensor locations and/or in tracking of the blade position and/or in the data collection process. Therefore, in the presence of some amount of AWC system error, the best-fit algorithm will iterate on $O_x$ and $O_y$ until the performance index (IP) minimizes to some non-zero value that places the wafer edge as close to the N detected wafer edge locations $Ba_i$ (for i=1 to N) as possible.

As shown in Equation 4, each estimate of the wafer offset O (i.e., $O_x$, $O_y$) generates a performance index (IP) value for the N vectors $Ba_i$ (for i=1 to N). A poor estimate of the wafer offset O generates a higher performance index (IP) value. The best estimate of the wafer offset O minimizes the performance index (IP) value. When the performance index (IP) value is minimized, the wafer edge is as close to the detected wafer edge locations $Ba_i$ (for i=1 to N) as possible.

The best-fit algorithm steps through different estimates of the wafer offset O to identify the wafer offset O that minimizes the performance index (IP) value. In some embodiments, the estimated wafer offset O is adjusted by iteration until a corresponding change in the minimized value of the performance index (IP) between iterations is equal to or less than a specified iteration-stop value. In some embodiments, the iteration-stop value can be 0.00001. However, in other embodiments, the iteration-stop value can be either greater than or less than 0.00001. In some embodiments, Newton's Method is used to iterate on the estimated wafer offset O to determine the minimized value of the performance index (IP). In these embodiments, Newton's Method includes determining the derivatives of the performance index (IP) with respect to $O_x$ and $O_y$, and setting those derivatives equal to zero, which corresponds to a local minimum of the performance index (IP). Also, in some embodiments, a second derivative of the performance index (IP) with respect to $O_x$ and $O_y$ can be evaluated to determine an amount of adjustment in the estimated wafer offset O from one iteration to the next iteration as the performance index (IP) is taken to its minimum value.

In the fiducial-filtering AWC process, if there is fiducial interference with a sensor, one of the N vectors $Ba_i$ (for i=1 to N) will not lie on the outer peripheral edge of the wafer, i.e., on the circumference of the wafer. In this case, where fiducial interference with a sensor is present, there will be no value of the wafer offset O that will position the center of the wafer so that the edge of the wafer goes through all N detected wafer edge locations $Ba_i$ (for i=1 to N).

The fiducial interference with the sensor will only affect one of the N vectors $Ba_i$ (for i=1 to N). To identify which of the N vectors $Ba_i$ (for i=1 to N) has been affected by the fiducial interference, the fiducial-filtering AWC process includes elimination of a different one of the N vectors $Ba_i$ (for i=1 to N) at a time to get a unique set of (N−1) vectors $Ba_i$, along with performance of the best-fit algorithm to identify the wafer offset O that minimizes the performance index (IP) value for each unique set of (N−1) vectors $Ba_i$. Equation 5 shows the performance index ($IP_z$) value for a unique set of (N−1) vectors $Ba_i$ that excludes the z-th vector $Ba_z$.

$$IP_z = \left\{ \sum_{i=1}^{N} \left[ R - \sqrt{(Ba_{ix} - O_x)^2 + (Ba_{iy} - O_y)^2} \right]^2 \right\} - \left[ R - \sqrt{(Ba_{zx} - O_x)^2 + (Ba_{zy} - O_y)^2} \right]^2. \qquad \text{Equation 5}$$

The wafer offset O that minimizes the performance index ($IP_z$) is determined for each (z) value in the range from 1 to N. After the best-fit algorithm has converged for the (N−1) vectors $Ba_i$ to a resultant minimum value for the performance index ($IP_z$) for a given (z) excluded vector $Ba_z$, the resultant minimum value for the performance index ($IP_z$) and the corresponding estimated wafer offset O are recorded for the given (z) excluded vector $Ba_z$. The above process will give N estimates of the wafer offset O, and each estimate of the wafer offset O will have a corresponding performance index ($IP_z$). In other words, for each excluded vector $Ba_z$ (for z=1 to N), there is a separate estimate of the wafer offset O and corresponding performance index ($IP_z$) determined using the (N−1) vectors $Ba_i$ that were not excluded.

As an example, consider the AWC configuration of FIG. 2. In this configuration, there are N=6 vectors $Ba_1$, $Ba_2$, $Ba_3$, $Ba_4$, $Ba_5$, and $Ba_6$. For this configuration, the fiducial-filtering AWC process includes determination of six different estimates of the wafer offset O with its corresponding performance index ($IP_z$). Specifically, for the first estimate (z=1), the vector $Ba_1$ is excluded and the set of vectors ($Ba_2$, $Ba_3$, $Ba_4$, $Ba_5$, $Ba_6$) determine the estimate of the wafer offset O. For the second estimate (z=2), the vector $Ba_2$ is excluded and the set of vectors ($Ba_1$, $Ba_3$, $Ba_4$, $Ba_5$, $Ba_6$) determine the estimate of the wafer offset O. For the third estimate (z=3), the vector $Ba_3$ is excluded and the set of vectors ($Ba_1$, $Ba_2$, $Ba_4$, $Ba_5$, $Ba_6$) determine the estimate of the wafer offset O. For the fourth estimate (z=4), the vector $Ba_4$ is excluded and the set of vectors ($Ba_1$, $Ba_2$, $Ba_3$, $Ba_5$, $Ba_6$) determine the estimate of the wafer offset O. For the fifth estimate (z=5), the vector $Ba_5$ is excluded and the set of vectors ($Ba_1$, $Ba_2$, $Ba_3$, $Ba_4$, $Ba_6$) determine the estimate of the wafer offset O. For the fifth estimate (z=5), the vector $Ba_5$ is excluded and the set of vectors ($Ba_1$, $Ba_2$, $Ba_3$, $Ba_4$, $Ba_6$) determine the estimate of the wafer offset O. For the sixth estimate (z=6), the vector $Ba_6$ is excluded and the set of vectors ($Ba_1$, $Ba_2$, $Ba_3$, $Ba_4$, $Ba_5$) determine the estimate of the wafer offset O.

Because the fiducial interference affects only one of the vectors $Ba_i$ (for i=1 to 6), only one of the six determined estimates of the wafer offset O will not be affected by the fiducial interference. The estimate of the wafer offset O that has the lowest corresponding performance index ($IP_z$) is based on the set of (N−1) vectors $Ba_i$ that does not include the vector $Ba_z$ affected by the fiducial interference with the sensor. Therefore, the estimate of the wafer offset O that has the lowest corresponding performance index ($IP_z$) is the estimate of the wafer offset O that has not been influenced by the fiducial interference with the sensor. An underlying assumption is that while each AWC sensor is expected to have some small level of noise (i.e., error in its location calibration and/or error in its signal transition and/or error in its signal transmission), the one sensor that encounters fiducial interference will have a corresponding amount of error in its detection of the wafer edge that is significantly larger than any error of the other sensors in detecting the wafer edge due to noise.

The fiducial-filtering AWC process for three AWC sensors, such as shown in FIG. 2, determines the unique set of five vectors $Ba_i$ (out of the six vectors $Ba_i$ (for i=1 to 6)) that yields the lowest performance index (IP). This unique set of five vectors $Ba_i$ does not include the vector $Ba_i$ that was affected by the fiducial interference with the sensor, thereby identifying the vector $Ba_i$ that was affected by the fiducial interference with the sensor. And, the estimated wafer offset O determined for this unique set of five vectors $Ba_i$ is the wafer offset O that has not been affected by the fiducial interference with the sensor.

As discussed above, the conventional approach to fiducial interference detection requires that the operator choose a somewhat arbitrary threshold value of error in the estimated wafer radius R to determine which vector $Ba_i$ (for i=1 to N) is affected by the fiducial interference. Typically, cases are encountered where more than one combination of three vectors $Ba_i$ meets the chosen threshold value of error in the estimated wafer radius R, and the selection of the erroneous data becomes arbitrary. There are also cases where none of the combinations of three vectors $Ba_i$ meet the threshold value of error in the estimated wafer radius R, even though one vector $Ba_i$ has some error. In contrast, in the fiducial-filtering AWC process disclosed herein, determination of the unique group of (N−1) vectors $Ba_i$ that has the lowest corresponding performance index ($IP_z$) identifies which vector $Ba_i$ has been affected by fiducial interference with an AWC sensor. And, the unique group of (N−1) vectors $Ba_i$ that has the lowest corresponding performance index ($IP_z$) is used to determine the wafer offset O for directing the robot to center the wafer at the target station.

It should be understood that the fiducial-filtering AWC process and associated systems disclosed herein support high wafer throughput operations in a fabrication facility by enabling elimination of the time required for wafer fiducial detection and alignment in a dedicated aligner module. Also, the fiducial-filtering AWC process and associated systems disclosed herein provide for precise and reliable determination of the wafer center with an unknown fiducial location, i.e., with the possibility of having fiducial interference with an AWC sensor.

Figure 4:
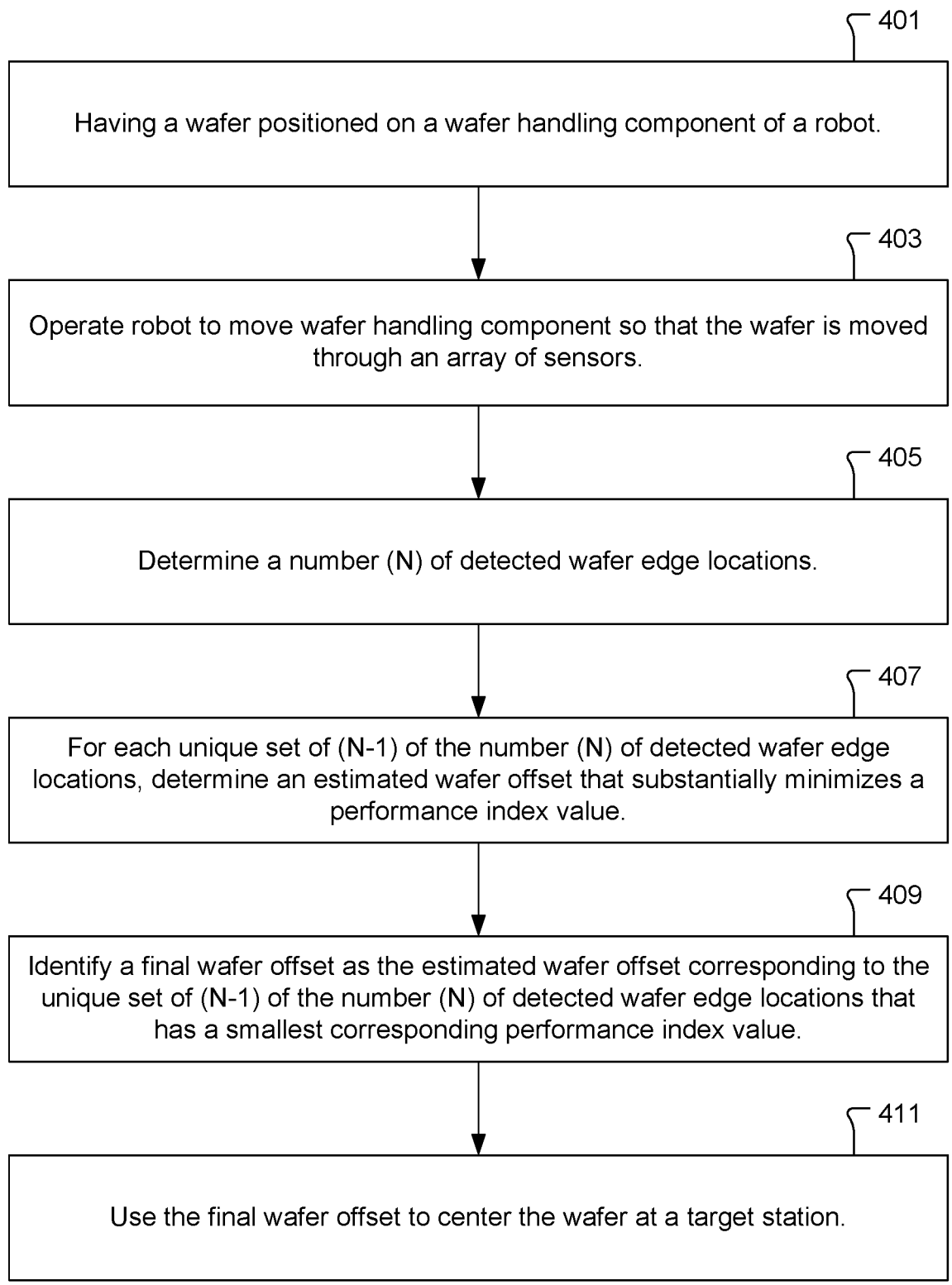
FIG. 4 shows a flowchart of a method for automatic wafer centering, in accordance with some embodiments.

FIG. 4 shows a flowchart of a method for automatic wafer centering, in accordance with some embodiments. The method includes an operation 401 for having a wafer positioned on a wafer handling component of a robot. The method also includes an operation 403 for operating the robot to move the wafer handling component so that the wafer is moved through an array of sensors. Each sensor within the array of sensors is configured to detect and signal when an edge of the wafer passes by the sensor. In some embodiments, the array of sensors includes at least three sensors. In some embodiments, the array of sensors includes at least one sensor positioned to pass over a first half of the wafer relative to a direction of travel of a center of the wafer as the wafer is moved through the array of sensors. And, the array of sensors includes at least one sensor positioned to pass over a second half of the wafer relative to the direction of travel of the center of the wafer as the wafer is moved through the array of sensors. In some embodiments, each sensor in the array of sensors is a light beam sensor, e.g., LED beam sensor. In some embodiments, the light beam sensor is configured to transmit a signal indicating detection of the edge of the wafer when a light beam of the light beam sensor is broken by the wafer. And, the light beam sensor is configured to transmit a signal indicating detection of the edge of the wafer when a broken light beam of the light beam sensor is reformed.

The method also includes an operation 405 for determining a number (N) of detected wafer edge locations. Each detected wafer edge location is defined by a set of coordinates (x, y) in a coordinate system of the wafer handling component at which any sensor of the array of sensors detects the edge of the wafer as the wafer is moved through the array of sensors. The method also includes an operation 407 in which for each unique set of (N−1) of the number (N) of detected wafer edge locations, an estimated wafer offset is determined that substantially minimizes a performance index value. The estimated wafer offset is defined as a vector extending from a center of the coordinate system of the wafer handling component to an estimated center location of the wafer. Each unique set of (N−1) of the number (N) of detected wafer edge locations has a corresponding estimated wafer offset and a corresponding performance index value. The estimated wafer offset for a given unique set of (N−1) of the number (N) of detected wafer edge locations corresponds to a center of a circle that is best fit to the given unique set of (N−1) of the number (N) of detected wafer edge locations within the coordinate system of the wafer handling component. The performance index (IP) for any estimated wafer center ($O_x$, $O_y$) is the square of the difference between the estimated wafer radius ($|E_i|$) at the i-th detected wafer edge location and the nominal wafer radius R summed over the unique set of (N−1) of the number N of detected wafer edge locations. When minimized, the performance index (IP) and the associated estimated wafer center ($O_x$, $O_y$) correspond to a circle that is best fit to the given unique set of (N−1) of the number (N) of detected wafer edge locations within the coordinate system of the wafer handling component.

The method also includes an operation 409 for identifying a final wafer offset as the estimated wafer offset corresponding to the unique set of (N−1) of the number (N) of detected wafer edge locations that has a smallest corresponding performance index value. The unique set of (N−1) of the number (N) of detected wafer edge locations that has the smallest corresponding performance index value excludes one of the number (N) of detected wafer edge locations at a fiducial of the wafer. The method also includes an operation 411 for using the final wafer offset to center the wafer at a target station.

Figure 5:
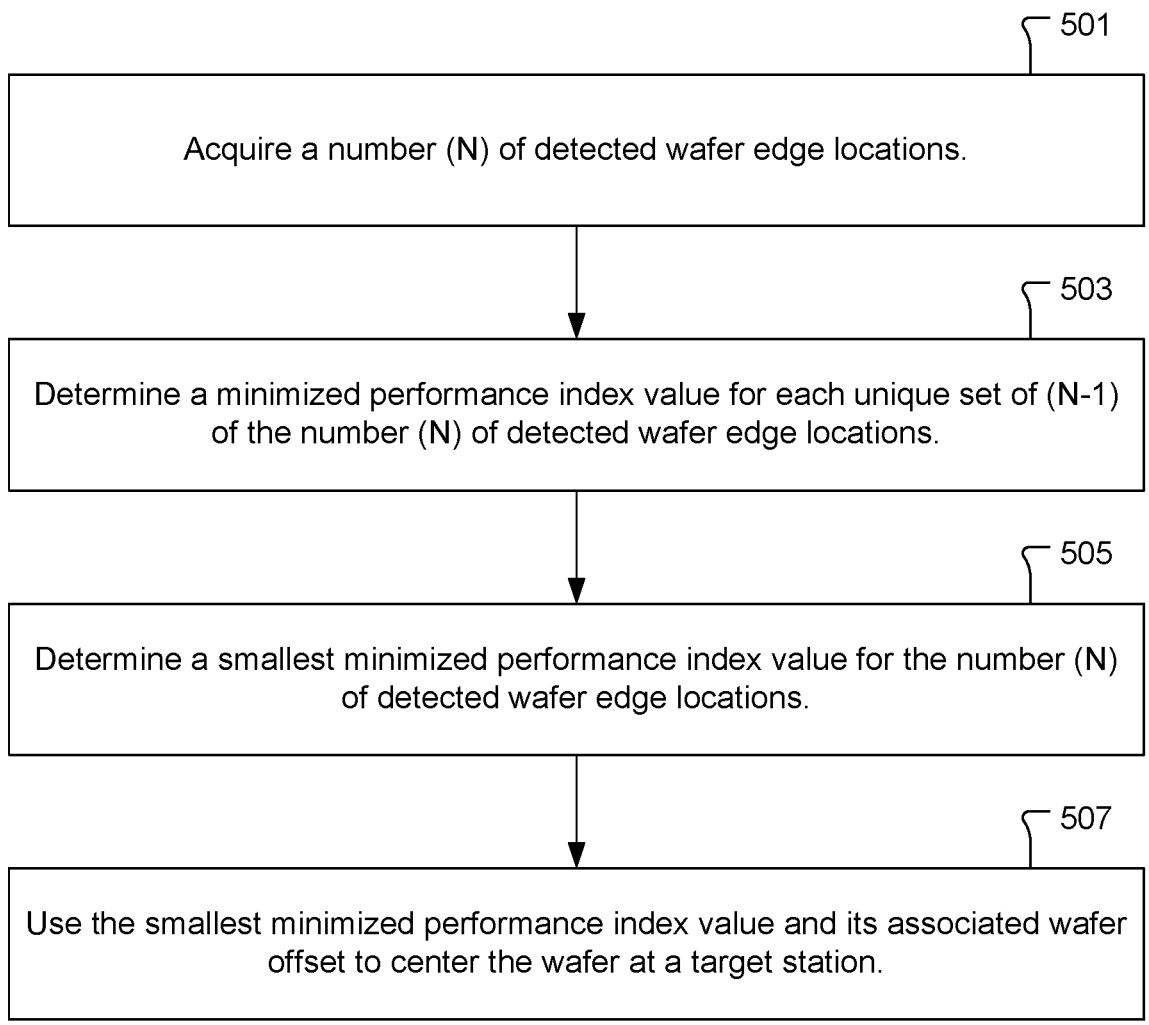
FIG. 5 shows a flowchart of a method for automatic wafer centering, in accordance with some embodiments.

FIG. 5 shows a flowchart of a method for automatic wafer centering, in accordance with some embodiments. The method includes an operation 501 for acquiring a number (N) of detected wafer edge locations. Each detected wafer edge location is defined by a set of coordinates (x, y) in a coordinate system of a wafer handling component. In some embodiments, the number (N) of detected wafer edge locations are acquired by passing the wafer through an array of light beam sensors that includes at least three sensors. The method also includes an operation 503 for determining a minimized performance index value for each unique set of (N−1) of the number (N) of detected wafer edge locations. The minimized performance index value has an associated estimated wafer offset that corresponds to a center of a circle that is best fit to a corresponding unique set of (N−1) of the number (N) of detected wafer edge locations within the coordinate system of the wafer handling component.

The method also includes an operation 505 for determining a smallest minimized performance index value for the number (N) of detected wafer edge locations. The smallest minimized performance index value having an associated wafer offset. The performance index (IP) for any estimated wafer center ($O_x$, $O_y$) is the square of the difference between the estimated wafer radius ($|E_i|$) at the i-th detected wafer edge location and the nominal wafer radius R summed over the unique set of (N−1) of the number N of detected wafer edge locations. When minimized, the performance index (IP) and the associated estimated wafer center ($O_x$, $O_y$) correspond to a circle that is best fit to the given unique set of (N−1) of the number (N) of detected wafer edge locations within the coordinate system of the wafer handling component. The unique set of (N−1) of the number (N) of detected wafer edge locations that has the smallest performance index value for the corresponding estimated wafer offset excludes one of the number (N) of detected wafer edge locations at a fiducial of the wafer. The method also includes an operation 507 for using the smallest minimized performance index value and its associated wafer offset to center the wafer at a target station.

Figure 6:
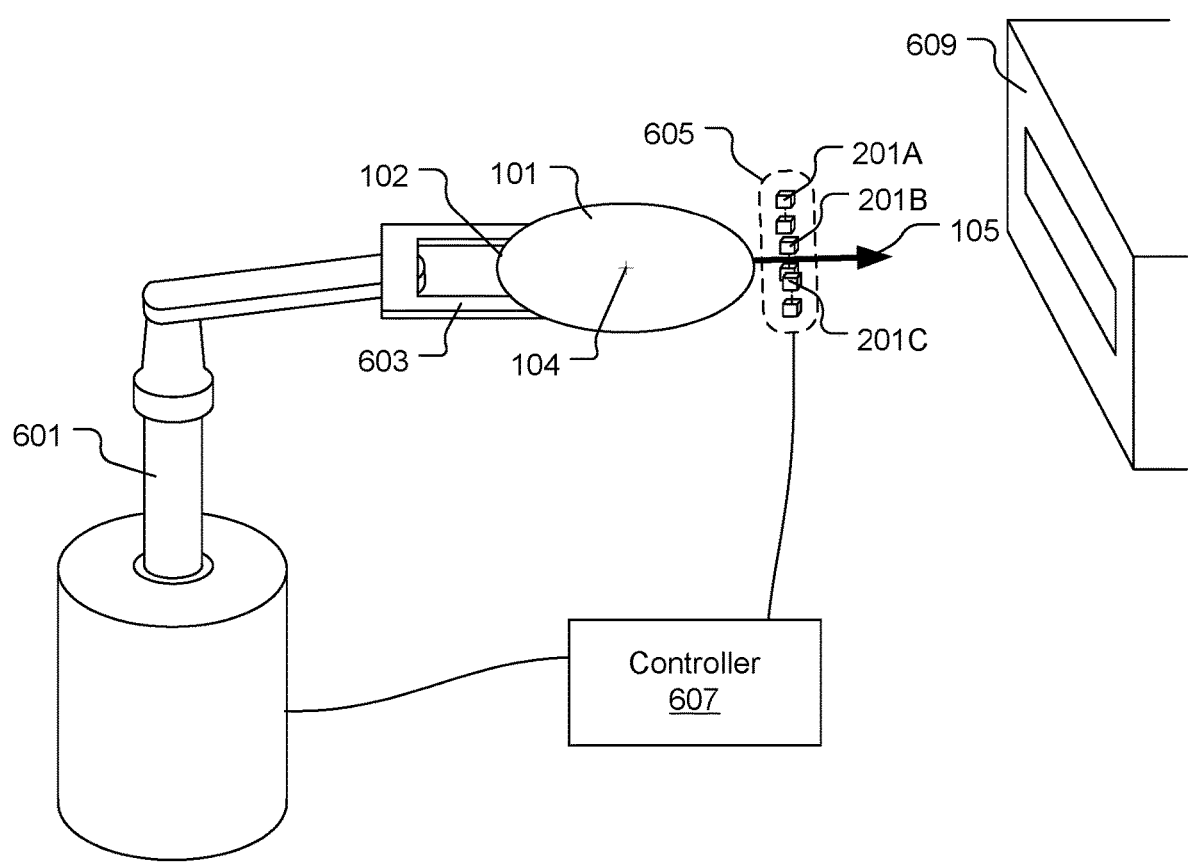
FIG. 6 shows a system for automatic wafer centering, in accordance with some embodiments.

FIG. 6 shows a system for automatic wafer centering, in accordance with some embodiments. The system includes a robot 601 having a wafer handling component 603, e.g., blade. The system also includes an array of sensors 605. The array of sensors 605 includes the plurality of sensors 201A, 201B, 201C. Each sensor 201A, 201B, 201C within the array of sensors 605 is configured to detect when an edge of a wafer 101 passes by the sensor 201A, 201B, 201C. In some embodiments, the array of sensors 605 includes at least three sensors 201A, 201B, 201C. In some embodiments, the array of sensors 605 includes at least one sensor 201A positioned to pass over a first half of the wafer 101 relative to the direction of travel 105 of the center 104 of the wafer 101 as the wafer 101 is moved through the array of sensors 605 (see FIG. 2). And, the array of sensors 605 includes at least one sensor 201B, 201C positioned to pass over a second half of the wafer 101 relative to the direction of travel 105 of the center 104 of the wafer 101 as the wafer 101 is moved through the array of sensors 605. In some embodiments, each sensor 201A, 201B, 201C in the array of sensors 605 is a light beam sensor. In some embodiments, the light beam sensor is configured to transmit a signal indicating detection of the edge of the wafer 101 when a light beam of the light beam sensor is broken by the wafer 101. And, the light beam sensor is configured to transmit a signal indicating detection of the edge of the wafer 101 when a broken light beam of the light beam sensor is reformed.

The system also includes a controller 607 configured and connected to receive signals from each of the sensors 201A, 201B, 201C within the array of sensors 605. The controller 607 is also configured and connected to receive signals from the robot 601. The controller 607 is also configured and connected to transmit signals to the robot 601. The controller 607 is configured to receive data indicating a position of the wafer handling component 603 of the robot 601 as the wafer handling component 603 is moved with the wafer 101 held on the wafer handling component 603. The controller 607 is configured to receive signals from the array of sensors 605 as the wafer 101 is moved through the array of sensors 605. The signals indicate when the edge of the wafer 101 passes by a particular sensor 201A, 201B, 201C of the array of sensors 605. The controller 607 is configured to determine a number (N) of detected wafer edge locations. Each detected wafer edge location is defined by a set of coordinates (x, y) in a coordinate system of the wafer handling component 603 at which any sensor 201A, 201B, 201C of the array of sensors 605 detects the edge of the wafer 101.

The controller 607 is configured to determine an estimated wafer offset that substantially minimizes a performance index value for each unique set of (N−1) of the number (N) of detected wafer edge locations. The estimated wafer offset is defined as a vector extending from a center of the coordinate system of the wafer handling component 603 to an estimated center location of the wafer 101. Each unique set of (N−1) of the number (N) of detected wafer edge locations has a corresponding estimated wafer offset and a corresponding performance index value. The estimated wafer offset for a given unique set of (N−1) of the number (N) of detected wafer edge locations corresponds to a center of a circle that is best fit to the given unique set of (N−1) of the number (N) of detected wafer edge locations within the coordinate system of the wafer handling component 603. The performance index (IP) for any estimated wafer center ($O_x$, $O_y$) is the square of the difference between the estimated wafer radius OEM at the i-th detected wafer edge location of the wafer 101 and the nominal wafer radius R summed over the unique set of (N−1) of the number N of detected wafer edge locations. When minimized, the performance index (IP) and the associated estimated wafer center ($O_x$, $O_y$) correspond to a circle that is best fit to the given unique set of (N−1) of the number (N) of detected wafer edge locations within the coordinate system of the wafer handling component 603.

The controller 607 is also configured to identify a final wafer offset as the estimated wafer offset corresponding to the unique set of (N−1) of the number (N) of detected wafer edge locations that has a smallest corresponding performance index value. The unique set of (N−1) of the number (N) of detected wafer edge locations that has the smallest corresponding performance index value excludes one of the number (N) of detected wafer edge locations at the fiducial 102 of the wafer 101. The controller 607 is configured to use the final wafer offset to direct the robot 601 to center the wafer 101 at a target station 609.

Figure 7:
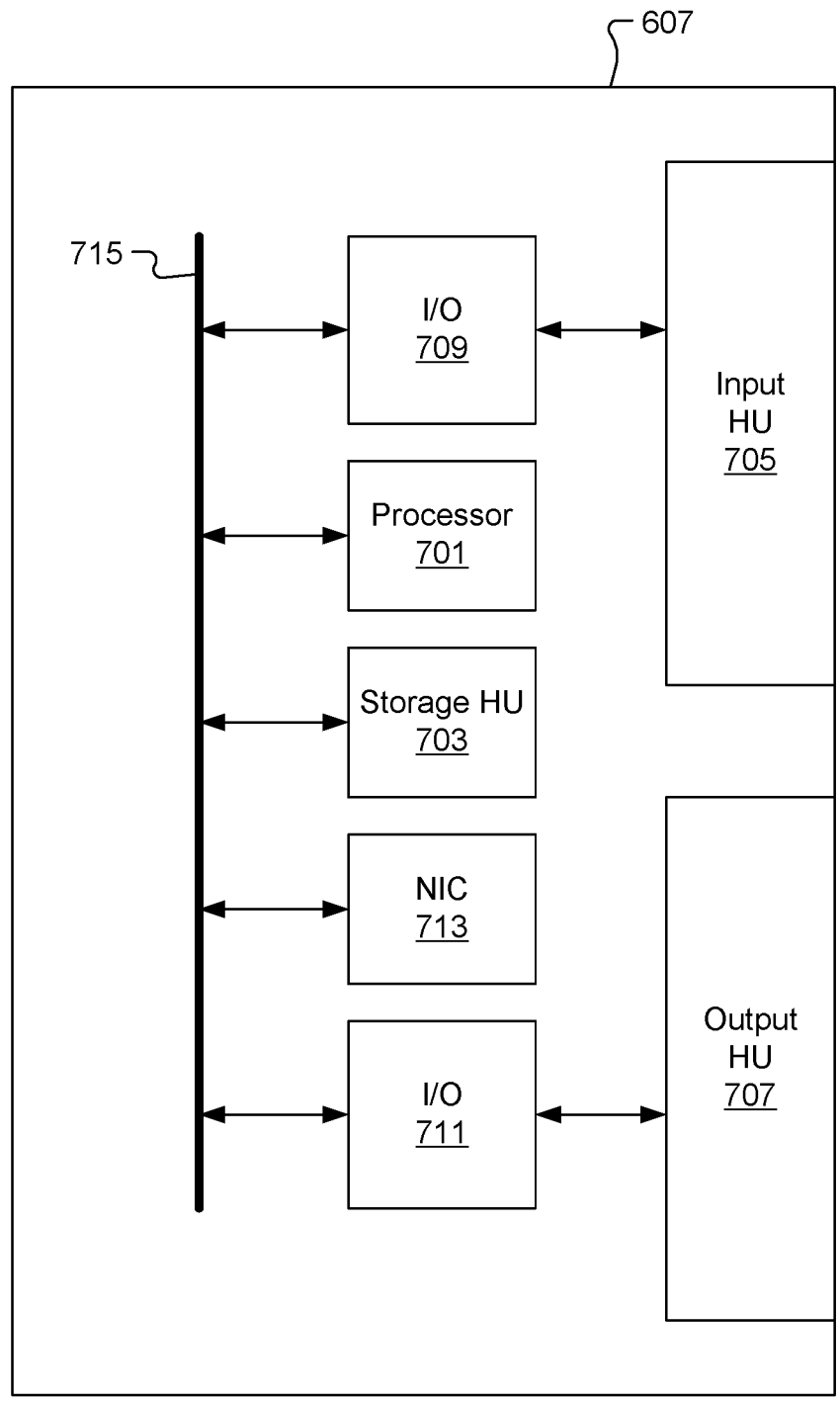
FIG. 7 shows an example diagram of the controller 607, in accordance with some embodiments.

FIG. 7 shows an example diagram of the controller 607, in accordance with some embodiments. In various embodiments, the controller 607 includes a processor 701, a storage hardware unit (HU) 703 (e.g., memory), an input HU 705, an output HU 707, an input/output (I/O) interface 709, an I/O interface 711, a network interface controller (NIC) 713, and a data communication bus 715. The processor 70, the storage HU 703, the input HU 705, the output HU 707, the I/O interface 709, the I/O interface 711, and the NIC 713 can be in data communication with each other by way of the data communication bus 715. The input HU 705 is configured to receive data communication from a number of external devices, such as the robot 601 and the sensors 201A, 201B, 201C. Examples of the input HU 705 include a data acquisition system, a data acquisition card, etc. The output HU 707 is configured to transmit data to a number of external devices, such as the robot 601. An example of the output HU 707 is a device controller. Examples of the NIC 713 include a network interface card, a network adapter, etc. Each of the I/O interfaces 709 and 711 is defined to provide compatibility between different hardware units coupled to the I/O interface. For example, the I/O interface 709 can be defined to convert a signal received from the input HU 705 into a form, amplitude, and/or speed compatible with the data communication bus 715. Also, the I/O interface 707 can be defined to convert a signal received from the data communication bus 715 into a form, amplitude, and/or speed compatible with the output HU 707. Although various operations are described herein as being performed by the processor 701 of the controller 607, it should be understood that in some embodiments various operations can be performed by multiple processors of the controller 607 and/or by multiple processors of multiple computing systems in data communication with the controller 607. Also, in some embodiments, there is a user interface associated with the controller 607. The user interface may include a display (e.g., a display screen and/or graphical software displays of the apparatus and/or process conditions) and user input devices such as pointing devices, keyboards, touch screens, microphones, etc.

The controller 607 can be configured to execute computer programs including sets of instructions for controlling operation of the robot 601 and for performing the fiducial-filtering AWC process disclosed herein. Also, computer programs stored on memory devices associated with the controller 607 may be employed in some embodiments. Software for directing operation of the controller 607 may be designed or configured in many different ways. Computer programs for directing operation of the controller 607 to perform the fiducial-filtering AWC process and correspondingly control the robot 601 can be written in any conventional computer readable programming language: for example, assembly language, C, C++, Pascal, Fortran or others. Compiled object code or script is executed by the processor 701 to perform the tasks identified in the program.

Broadly speaking, the controller 607 may be defined as electronics having various integrated circuits, logic, memory, and/or software that receive instructions, issue instructions, and control operations. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller 607 in the form of various individual settings (or program files), defining operational parameters for carrying out the fiducial-filtering AWC process and controlling the robot 601.

Embodiments described herein may also be practiced with various computer system configurations including hand-held hardware units, microprocessor systems, microprocessor-based or programmable consumer electronics, minicomputers, mainframe computers and the like. Embodiments described herein can also be practiced in distributed computing environments where tasks are performed by remote processing hardware units that are linked through a network. It should be understood that the embodiments described herein can employ various computer-implemented operations involving data stored in computer systems. These operations are those requiring physical manipulation of physical quantities. Any of the operations described herein that form part of the embodiments are useful machine operations. The embodiments also relate to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network, the data may be processed by other computers on the network, e.g., a cloud of computing resources.

Various embodiments described herein can be implemented through AWC process control instructions instantiated as computer-readable code on a non-transitory computer-readable medium. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes, and other optical and non-optical data storage hardware units. The non-transitory computer-readable medium can include computer-readable tangible medium distributed over a network-coupled computer system so that the computer-readable code is stored and executed in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein.

Accordingly, the present embodiments are to be considered as illustrative and not restrictive, and what is claimed is not to be limited to the details given herein, but may be modified within the scope and equivalents of the described embodiments.

What is claimed is:

1. A method for automatic wafer centering, comprising:
having a wafer positioned on a wafer handling component of a robot;
operating the robot to move the wafer handling component so that the wafer is moved through an array of sensors, each sensor within the array of sensors configured to detect and signal when an edge of the wafer passes by the sensor;
determining a number (N) of detected wafer edge locations, each detected wafer edge location defined by a set of coordinates (x, y) in a coordinate system of the wafer handling component at which any sensor of the array of sensors detects the edge of the wafer as the wafer is moved through the array of sensors;
for each unique set of (N−1) of the number (N) of detected wafer edge locations, determining an estimated wafer offset that minimizes a performance index value, the estimated wafer offset defined as a vector extending from a center of the coordinate system of the wafer handling component to an estimated center location of the wafer, each unique set of (N−1) of the number (N) of detected wafer edge locations having a corresponding estimated wafer offset and a corresponding performance index value;
identifying a final wafer offset as the estimated wafer offset corresponding to the unique set of (N−1) of the number (N) of detected wafer edge locations that has a smallest corresponding performance index value; and
using the final wafer offset to center the wafer at a target station.

2. The method as recited in claim 1, wherein the array of sensors includes at least three sensors.

3. The method as recited in claim 1, wherein the array of sensors includes at least one sensor positioned to pass over a first half of the wafer relative to a direction of travel of a center of the wafer as the wafer is moved through the array of sensors, and wherein the array of sensors includes at least one sensor positioned to pass over a second half of the wafer relative to the direction of travel of the center of the wafer as the wafer is moved through the array of sensors.

4. The method as recited in claim 1, wherein each sensor in the array of sensors is a light beam sensor.

5. The method as recited in claim 4, wherein the light beam sensor is configured to transmit a signal indicating detection of the edge of the wafer when a light beam of the light beam sensor is broken by the wafer, and wherein the light beam sensor is configured to transmit a signal indicating detection of the edge of the wafer when a broken light beam of the light beam sensor is reformed.

6. The method as recited in claim 1, wherein the estimated wafer offset for a given unique set of (N−1) of the number (N) of detected wafer edge locations corresponds to a center of a circle that is best fit to the given unique set of (N−1) of the number (N) of detected wafer edge locations within the coordinate system of the wafer handling component.

7. The method as recited in claim 6, wherein the performance index value is defined as a square of a difference between an estimated wafer radius and a known nominal radius of the wafer at an i-th detected wafer edge location of the wafer summed over the given unique set of (N−1) of the number (N) of detected wafer edge locations, wherein a minimized performance index value and an associated estimated wafer center correspond to the circle that is best fit to the given unique set of (N−1) of the number (N) of detected wafer edge locations within the coordinate system of the wafer handling component.

8. The method as recited in claim 1, wherein the unique set of (N−1) of the number (N) of detected wafer edge locations that has the smallest corresponding performance index value excludes one of the number (N) of detected wafer edge locations at a fiducial of the wafer.

9. A system for automatic wafer centering, comprising:
an array of sensors, each sensor within the array of sensors configured to detect when an edge of a wafer passes by the sensor; and
a controller configured to receive data indicating a position of a wafer handling component of a robot as the wafer handling component is moved with a wafer held on the wafer handling component, the controller configured to receive signals from the array of sensors as the wafer is moved through the array of sensors, the signals indicating when the edge of the wafer passes by a particular sensor of the array of sensors,
the controller configured to determine a number (N) of detected wafer edge locations, each detected wafer edge location defined by a set of coordinates (x, y) in a coordinate system of the wafer handling component at which any sensor of the array of sensors detects the edge of the wafer,
the controller configured to determine an estimated wafer offset that minimizes a performance index value for each unique set of (N−1) of the number (N) of detected wafer edge locations, the estimated wafer offset defined as a vector extending from a center of the coordinate system of the wafer handling component to an estimated center location of the wafer, each unique set of (N−1) of the number (N) of detected wafer edge locations having a corresponding estimated wafer offset and a corresponding performance index value,
the controller configured to identify a final wafer offset as the estimated wafer offset corresponding to the unique set of (N−1) of the number (N) of detected wafer edge locations that has a smallest corresponding performance index value,
the controller configured to use the final wafer offset to direct the robot to center the wafer at a target station.

10. The system as recited in claim 9, wherein the array of sensors includes at least three sensors.

11. The system as recited in claim 9, wherein the array of sensors includes at least one sensor positioned to pass over a first half of the wafer relative to a direction of travel of a center of the wafer as the wafer is moved through the array of sensors, and wherein the array of sensors includes at least one sensor positioned to pass over a second half of the wafer relative to the direction of travel of the center of the wafer as the wafer is moved through the array of sensors.

12. The system as recited in claim 9, wherein each sensor in the array of sensors is a light beam sensor.

13. The system as recited in claim 12, wherein the light beam sensor is configured to transmit a signal indicating detection of the edge of the wafer when a light beam of the light beam sensor is broken by the wafer, and wherein the light beam sensor is configured to transmit a signal indicating detection of the edge of the wafer when a broken light beam of the light beam sensor is reformed.

14. The system as recited in claim 9, wherein the estimated wafer offset for a given unique set of (N−1) of the number (N) of detected wafer edge locations corresponds to a center of a circle that is best fit to the given unique set of (N−1) of the number (N) of detected wafer edge locations within the coordinate system of the wafer handling component.

15. The system as recited in claim 14, wherein the performance index value is defined as a square of a difference between an estimated wafer radius and a known nominal radius of the wafer at an i-th detected wafer edge location of the wafer summed over the given unique set of (N−1) of the number (N) of detected wafer edge locations, wherein a minimized performance index value and an associated estimated wafer center correspond to the circle that is best fit to the given unique set of (N−1) of the number (N) of detected wafer edge locations within the coordinate system of the wafer handling component.

16. The system as recited in claim 9, wherein the unique set of (N−1) of the number (N) of detected wafer edge locations that has the smallest corresponding performance index value excludes one of the number (N) of detected wafer edge locations at a fiducial of the wafer.

17. A method for automatic wafer centering, comprising:
acquiring a number (N) of detected wafer edge locations, each detected wafer edge location defined by a set of coordinates (x, y) in a coordinate system of a wafer handling component;
determining a minimized performance index value for each unique set of (N−1) of the number (N) of detected wafer edge locations, wherein the minimized performance index value has an associated estimated wafer offset that corresponds to a center of a circle that is best fit to a corresponding unique set of (N−1) of the number (N) of detected wafer edge locations within the coordinate system of the wafer handling component;
determining a smallest minimized performance index value for the number (N) of detected wafer edge locations; and
using the smallest minimized performance index value and its associated wafer offset to center the wafer at a target station.

18. The method as recited in claim 17, wherein the number (N) of detected wafer edge locations are acquired by passing the wafer through an array of light beam sensors that includes at least three sensors.

19. The method as recited in claim 17, wherein the performance index value is defined as a square of a difference between an estimated wafer radius and a known nominal radius of the wafer at an i-th detected wafer edge location of the wafer summed over a given unique set of (N−1) of the number (N) of detected wafer edge locations.

20. The method as recited in claim 17, wherein a particular unique set of (N−1) of the number (N) of detected wafer edge locations that has the smallest minimized performance index value excludes one of the number (N) of detected wafer edge locations at a fiducial of the wafer.

* * * * *